United States Patent
Tamura et al.

(10) Patent No.: US 7,242,086 B2
(45) Date of Patent: Jul. 10, 2007

(54) OPTICAL SEMICONDUCTOR BARE CHIP, PRINTED WIRING BOARD, LIGHTING UNIT AND LIGHTING DEVICE

(75) Inventors: Tetsushi Tamura, Takatsuki (JP); Tatsumi Setomoto, Takatsuki (JP); Nobuyuki Matsui, Takatsuki (JP); Masanori Shimizu, Kyotanabe (JP); Yoshihisa Yamashita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/543,636

(22) PCT Filed: Dec. 24, 2003

(86) PCT No.: PCT/JP03/16537

§ 371 (c)(1),
(2), (4) Date: Jul. 28, 2005

(87) PCT Pub. No.: WO2004/068595

PCT Pub. Date: Aug. 12, 2004

(65) Prior Publication Data

US 2006/0104563 A1    May 18, 2006

(30) Foreign Application Priority Data

Jan. 30, 2003 (JP) .............................. 2003-022184

(51) Int. Cl.
*H01L 23/053* (2006.01)
*H01L 23/12* (2006.01)
*H01L 23/48* (2006.01)
*H01L 23/52* (2006.01)

(52) U.S. Cl. .................. 257/701; 257/88; 257/432; 257/692; 257/778; 257/E23.007

(58) Field of Classification Search ............... 257/701, 257/778, 88, 432, 692
See application file for complete search history.

(56) References Cited

U.S. PATENT DOCUMENTS 6,164,836 A * 12/2000 Yamada et al. ............ 385/88

FOREIGN PATENT DOCUMENTS

| EP | 0 921 577 A1 | 12/1997 |
|---|---|---|
| JP | 55-16415 A | 2/1980 |
| JP | 2001-015817 A | 1/2001 |
| JP | 2001-230448 | 8/2001 |
| JP | 2002-094123 A | 3/2002 |

* cited by examiner

*Primary Examiner*—Nitin Parekh

(57) ABSTRACT

A wiring board used for mounting an LED bare chip capable of firmly bonding the LED bare chip and improving yield. In a printed wiring board 2, a distance D between wiring patterns 81 and 85 disposed so as to oppose each other is the smallest at a position nearest to a center point (G) of an LED chip 14 disposed at a designed location, and increases with an increasing distance from the point G. In addition, pattern edges 83 and 87 of the wiring patterns 81 and 85 recede in the direction of widening the distance D as a distance from the center point G increases with respect to electrode edges 148 and 149 of the LED chip 14.

10 Claims, 15 Drawing Sheets

OPTICAL SEMICONDUCTOR BARE CHIP, PRINTED WIRING BOARD, LIGHTING UNIT AND LIGHTING DEVICE

TECHNICAL FIELD

The present invention relates to an optical semiconductor bare chip such as an LED, a printed wiring board used for mounting an optical semiconductor bare chip thereon, a lighting unit, and a lighting apparatus.

BACKGROUND ART

In the field of lighting apparatus, a study has been conducted for using LED bare chips for a lighting apparatus by densely mounting many one-side-electrode type LED bare chips on a printed wiring board (hereinafter simply called "a wiring board") by a flip chip method using ultrasonic bonding. In the lighting apparatus, each LED chip has several hundred μm square in size and has p-electrodes and n-electrodes on one surface.

FIG. 18A is an enlarged plan view showing an LED chip 710 flip-chip mounted on a wiring pattern 701 for a p-electrode and a wiring pattern 702 for an n-electrode, both attached to a wiring board 700. In FIG. 18A, to make a clear distinction between the LED chip 710 and the wiring patterns 701 and 702, the LED chip 710 is drawn with thick lines and the p-electrode 711 and the n-electrode 712, which are disposed on the reverse side (the under surface) of the LED chip 710, are drawn as viewed through the LED chip 710.

As shown in FIG. 18A, the p-electrode 711 and the n-electrode 712 on the one surface of the LED chip 710 are disposed so as to oppose each other and have a distance d therebetween (e.g. d is approximately 20 μm, where the LED 710 is 300 μm square).

Meanwhile, the wiring patterns 701 and 702 are disposed so as to oppose each other and have the distance d therebetween in accordance with the shapes of the corresponding p-electrode 711 and n-electrode 712. Here, the p-electrode 711 and the n-electrode 712 on the LED-chip 710 are electrically connected to the wiring pattern 701 and the wiring pattern 702 respectively so as to have surface contact, using the ultrasonic bonding.

Such a lighting apparatus is generally supplied with large amount of electricity to gain high optical output. Therefore, large amount of heat is liberated, and this might cause cracks at the junction of the LED chip 710 and the wiring board 700 due to the difference of thermal expansions. To avoid this problem, conventional arts increase the power level of the ultrasonic bonding, thereby increase the bonding strength.

However, if the bonding strength is increased by increasing the power level of the ultrasonic bonding, the LED chip 710 might be rotated a certain angle, as shown in FIG. 18B, from the position that the LED chip 710 should take when it is mounted ("normal mounting position", the position illustrated in FIG. 18A), and the p-electrode 711 and the n-electrode 712 might short out (in areas indicated by a sign a). The reason why this happens is the following. A flip chip bonder is used for mounting the LED chip 710. The flip chip bonder bonds the LED chip 710, which is attracted to the tip of a collet, to the wiring board 700 by applying ultrasonic vibration while placing and pressing the LED chip 710 onto the designed mounting location. If the power level is increased, the LED chip 710 wobbles by rotating a little around the collet as the rotation axis, and the LED chip 710 might be mounted after it is rotated from its normal mounting position. If the short circuit is caused, the LED does not function as a matter of course, and processing such as remounting will be required. This considerably reduces yields.

Such a problem can be caused not only in the case of mounting the LED chips, but also in the case of mounting optical semiconductors such as semiconductor lasers by the above-described method.

DISCLOSURE OF THE INVENTION

In view of the above problems, the present invention aims to provide an optical semiconductor bare chip, a printed wiring board for mounting the optical semiconductor bare chip thereon, a lighting unit, and a lighting apparatus, which are capable of firmly bonding the optical semiconductor bare chip, such as an LED chip, with use of a conventional flip-chip bonder, and improving yields.

The above object is fulfilled by a printed wiring board having first and second wiring patterns that are formed on a mounting surface thereof so as to oppose each other across an insulating region, an optical semiconductor bare chip being flip-chip mounted on the mounting surface and having, on one surface thereof, first and second electrodes that are disposed so as to oppose each other, and the first and second wiring patterns respectively corresponding in position and shape to the first and second electrodes, wherein in a plan view of the insulating region divided into a first region that includes a point nearest to a center point of the optical semiconductor bare chip that takes a normal mounting position, and second and third regions that sandwich the first region, (i) an outer edge portion of the first wiring pattern which adjoins the second region, and an outer edge portion of the second wiring pattern which adjoins the third region, and/or (ii) an outer edge portion of the first wiring pattern which adjoins the third region, and an outer edge portion of the second wiring pattern which adjoins the second region, are formed so as to recede inwardly as a distance from the center point increases with respect to outer edges of the first and second electrodes of the optical semiconductor bare chip that takes the normal mounting position.

Accordingly, even if the power level of the ultra sonic bonding at the time of the flip-chip mounting is increased and the optical semiconductor bare chip is mounted after it is rotated from its normal mounting position, the stated structure makes it possible to prevent the first electrode (e.g. the p-electrode) and the second electrode (e.g. the n-electrode) from causing a short circuit. Also, it becomes possible to improve yield, and prevent cracks occurring at the junction. This is realized by forming the receding parts at positions which are assumed to be in contact with the first and second electrodes when the optical semiconductor is mounted after it is rotated, and forming the outer edges of the first and second wiring patterns in the receding parts so as to recede inwardly not to be in contact with the outer edges of the first and second electrodes of the rotated optical semiconductor bare chip.

Here, in a case where a distance between the first and second electrodes measured at any point is substantially constant, the width of the first region is substantially constant and substantially equal to the distance between the first and the second electrodes.

In the case where a distance between the first and second electrodes measured at any point is substantially constant, the stated structure improves the yield and prevents cracks occurring at the junction.

The first and second wiring patterns are formed on a surface of an insulating plate that is a composite substrate including an inorganic filler and a resin composite. This makes it possible to manufacture the printed wiring board at low cost, and makes processing such as multilayering easy.

A lighting unit according to the present invention is a lighting unit in which an optical semiconductor bare chip is flip-chip mounted on a printed wiring board thereof, wherein the above-described printed wiring board is used as the printed wiring board used for mounting thereon the optical semiconductor bare chip.

A lighting apparatus according to the present invention is a lighting apparatus comprising the above-described lighting unit as the light source.

An optical semiconductor bare chip according to the present invention is an optical semiconductor bare chip having first and second electrodes that are disposed on one surface thereof so as to oppose each other across an insulating region, the semiconductor bare chip being flip-chip mounted on a mounting surface of a printed wiring board having first and second wiring patterns that are formed on the mounting surface so as to oppose each other, the first and second wiring patterns respectively corresponding in position and shape to the first and second electrodes, wherein in a plan view of the insulating region divided into a first region that includes a point nearest to a center point of the optical semiconductor bare chip, and second and third regions that sandwich the first region, (i) an outer edge portion of the first electrode which adjoins the second region and an outer edge portion of the second electrodes which adjoins the third region, and/or (ii) an outer edge portion of the first electrode which adjoins the third region and an outer edge portion of the second electrode which adjoins the second region, are formed so as to recede inwardly as a distance from the center point increases with respect to outer edges of the first and second wiring patterns that respectively correspond to the first and second electrodes of the optical semiconductor bare chip that takes a normal mounting position.

Accordingly, even if the power level of the ultra sonic bonding at the time of the flip-chip mounting is increased and the optical semiconductor bare chip is mounted after it is rotated from its normal mounting position, the stated structure makes it possible to prevent the first electrode (e.g. the p-electrode) and the second electrode (e.g. the n-electrode) from causing a short circuit. Also, it becomes possible to improve yield, and prevent cracks occurring at the junction. This is realized by forming the receding parts at positions which are assumed to be in contact with the first and second electrodes when the optical semiconductor is mounted after it is rotated, and forming the outer edges of the first and second electrodes in the receding parts so as to recede inwardly not to be in contact with the outer edges of the first and second wiring patterns of the rotated optical semiconductor bare chip.

Here, in a case where a distance between the first and second wiring patterns measured at any point is substantially constant, the width of the first region is substantially constant and substantially equal to the distance between the first and the second wiring patterns.

In the case where the distance between the first and second wiring patterns measured at any point is substantially constant, the stated structure improves the yield and prevents cracks occurring at the junction.

A lighting unit according to the present invention is a lighting unit in which an optical semiconductor bare chip is flip-chip mounted on a printed wiring board, wherein the above described optical semiconductor bare chip is used as the optical semiconductor bare chip that is to be mounted on the printed wiring board.

A lighting apparatus according to the present invention is a lighting apparatus comprising the above-described lighting unit as the light source.

BEST MODE FOR CARRYING OUT THE INVENTION

The following describes embodiments of the present invention, with reference to the attached figures.

The First Embodiment

Figure 1:
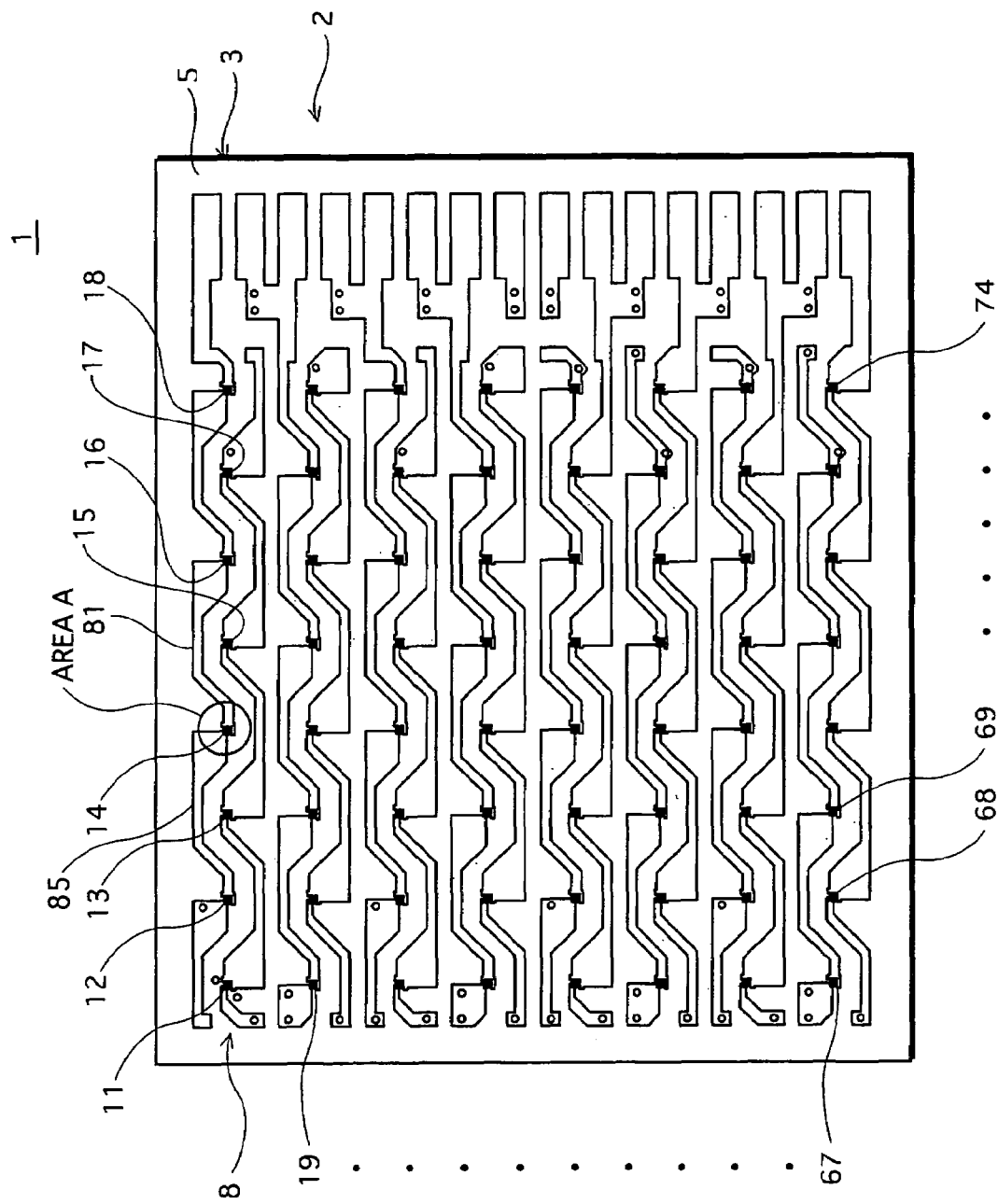
FIG. 1 is a plan view of a lighting unit 1 according to the first embodiment.

FIG. 1 is a plan view of a lighting unit 1 according to the first embodiment. The lighting unit 1 includes sixty-four LED chips 11 to 74 mounted on a wiring board 2 in an orderly manner so as to form a matrix having eight rows and eight columns. (The first row, the second row . . . and the eighth row are arranged from top to bottom, and the first column, the second column . . . and the eighth column are arranged from left to right.) Here, each of the LED chips 11 to 74 measures 300 (μm) in length and width in plan view.

The wiring board 2 has a structure in which a plurality of layers including substrates 3 and 4 (two layers in this embodiment) including wiring patterns 8 and 7 made of metal formed on the surfaces of insulating plates 5 and 6 (see FIG. 3) made of a thermosetting resin including an inorganic filler. In FIG. 1, only the top substrate 3 is visible. In this embodiment, the insulating plates 5 and 6 use alumina composite substrates that include alumina as an inorganic filler and epoxy as a thermosetting resin. The wiring patterns 7 and 8 use gold (Au). The wiring patterns 7 and 8 are formed mainly for connecting, in each column, the LED chips in odd-number rows and the LED chips in even-number rows in series.

Figure 2:
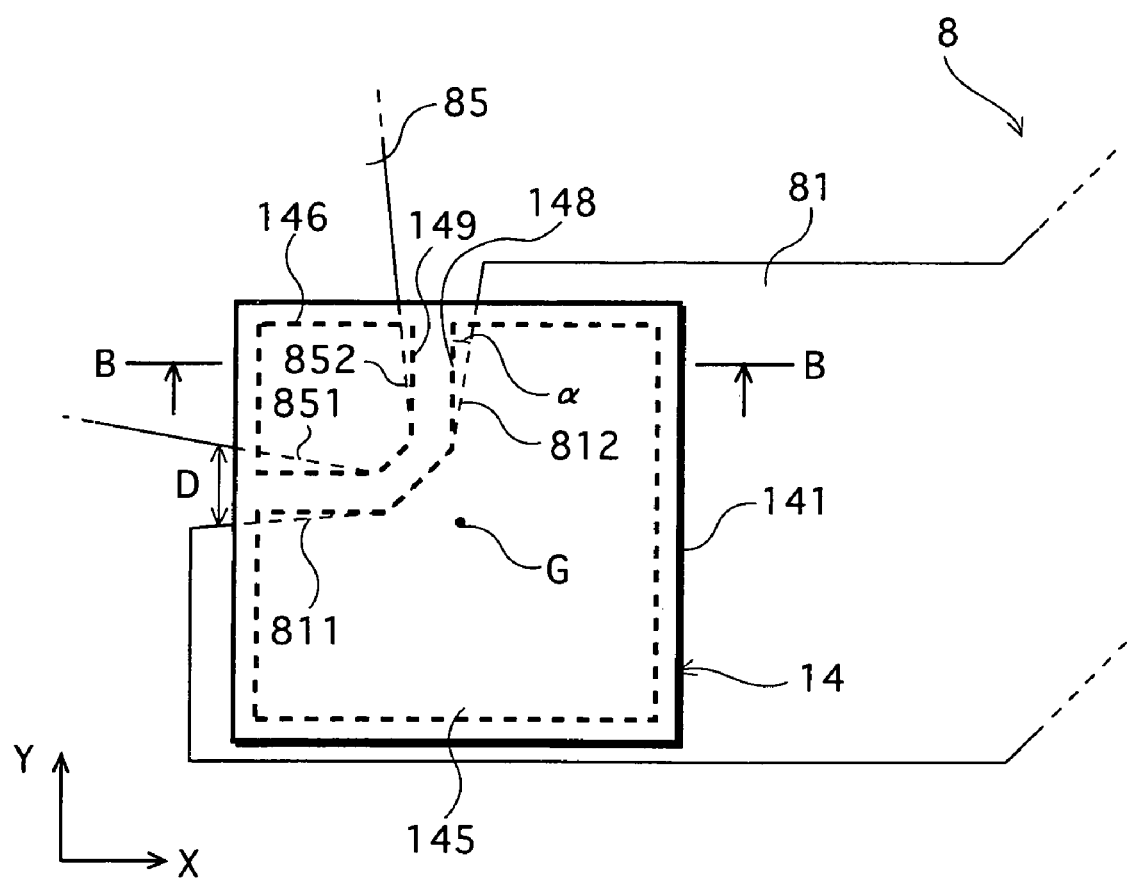
FIG. 2 shows details of a LED chip 14 and its vicinities.
Figure 3:
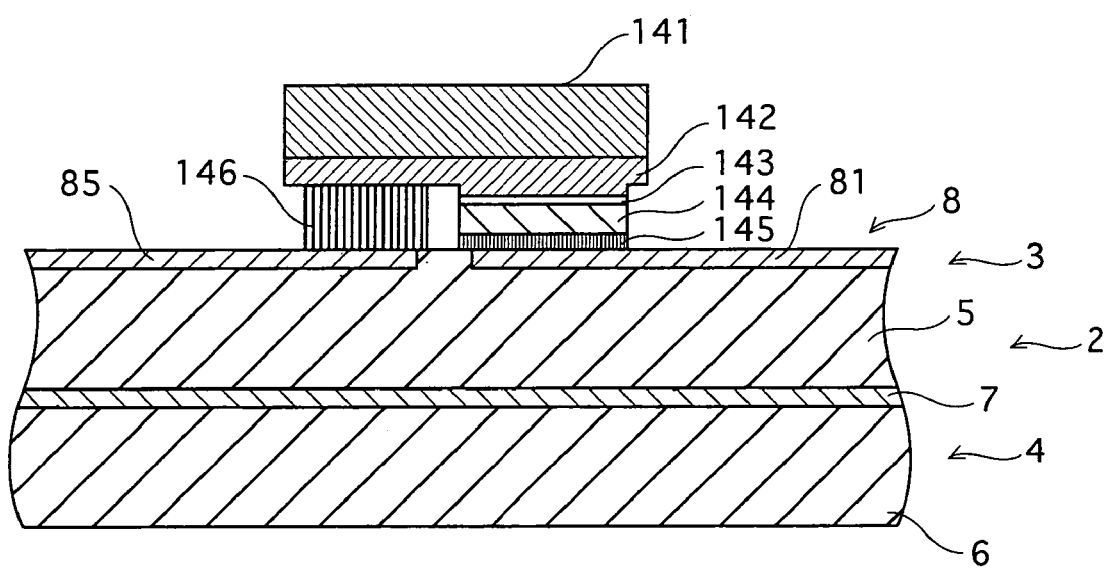
FIG. 3 is a cross-sectional view of an LED chip 14 and a printed wiring board 2, which are cut along a line B-B in FIG. 2 and viewed in the direction represented by arrows in FIG. 2.
Figure 4:
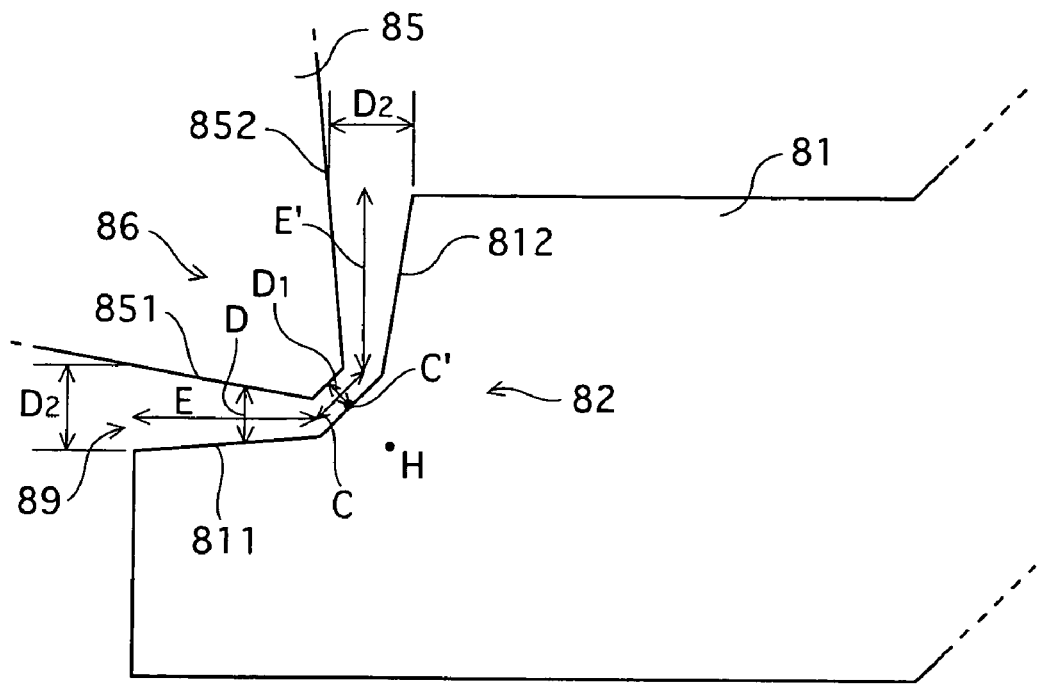
FIG. 4 is a plan view of wiring patterns 81 and 85, on which an LED chip 14 is not mounted yet.
Figure 5:
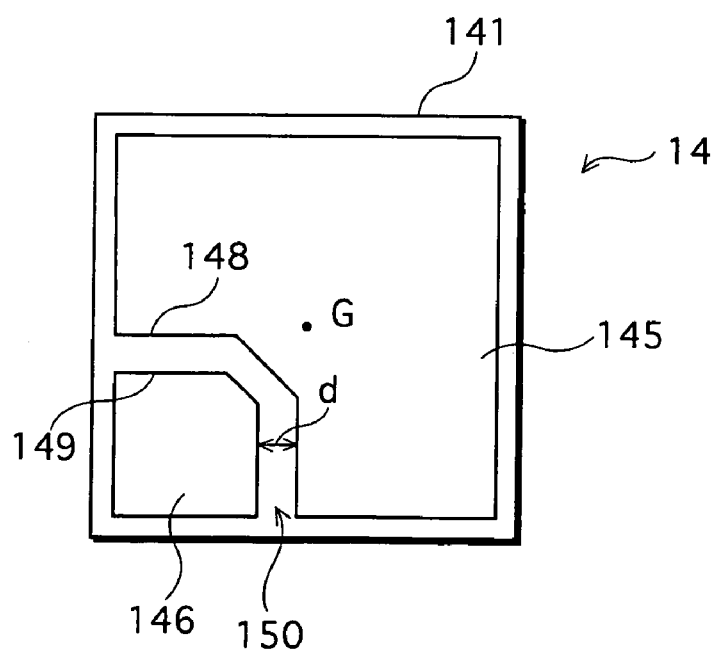
FIG. 5 is a plan view of a surface of an LED chip 14, on which electrodes are disposed.

FIG. 2 shows the details of an area A in FIG. 1, which includes an LED chip 14 at the intersection of the first row and the fourth column and its vicinity. FIG. 3 is a cross-sectional view of an LED chip 14 and a printed wiring board 2, which are cut along a line B-B in FIG. 2 and viewed in the direction represented by arrows in FIG. 2. FIG. 4 is a plan view of a mounting surface of the wiring board 2, on which the LED chip 14 is not mounted yet. FIG. 5 is a plan view of a surface of the LED chip 14, on which electrodes are disposed. FIG. 2 shows an example case where the LED chip 14 taking the normal mounting position is disposed exactly on a designed mounting location, without being displaced (or rotated). To make clear distinction between the LED chip 14 and wiring patterns 81 and 85, the LED chip 14 is drawn with thick lines, and an anode electrode (p-electrode) 145 and a cathode electrode (n-electrode) 146, which are disposed on the reverse side (the under surface) of the LED chip 14, are drawn as viewed through the LED chip 14.

As shown in each figure, the LED chip 14 has a structure in which an AlInGaN-based N-type layer 142, an active layer 143 and an AlInGaN-based P-type layer 144 are laminated on a sapphire substrate 141 which is insulative and transparent, and the power is fed to the LED chip 14 via the p-electrode 145 disposed on the P-type layer and the n-electrode 146 disposed on the N-type layer.

Meanwhile, positions of one end portion 82 of a first wiring pattern 81 and one end portion 86 of a second wiring pattern 85, both included in the wiring pattern 8, correspond to the positions of the p-electrode 145 and the n-electrode 146 respectively. The shapes of the end portions are respectively similar to the shapes of the electrodes as well.

The LED chip 14 has a structure in which the p-electrode 145 and the n-electrode 146 are disposed so as to oppose each other on one surface of the LED-chip 14. The LED chip 14 is to be mounted by the flip chip method, and as mounted, the p-electrode 145 of the LED chip 14 is electrically connected to the one end portion 82 of the wiring pattern 81 and the n-electrode 146 of the LED chip 14 is electrically connected to the one end portion 86 of the wiring pattern 85. Obviously, the other end portion of the wiring pattern 81 is to be connected to the n-electrode of an LED chip 16 (FIG. 1), and the other end portion of the wiring pattern 85 is to be connected to the p-electrode of an LED chip 12.

As described in Background Art, the flip chip bonder (not illustrated) is used for mounting the LED chip 14. The flip chip bonder is an apparatus that bonds the LED chip 14 onto the wiring board 2 by controlling the motion of a stage carrying the wiring board 2 to adjust the designed mounting location on the wiring board 2 to the position of the collet holding the LED chip 14 carried from other place and standing still, lowering the collet, and applying ultrasonic vibration for a predetermined period while pressing the LED chip 14 onto the wiring board 2.

More specifically, two recognition marks (not illustrated) are preformed on the insulating plate 5 so that the center point of the designed mounting location (the point H shown in FIG. 4) is located between the marks. The flip chip bonder recognizes the positions of the recognition marks by an image recognition device, and calculates the position of the center point of the designed mounting location (the point H) from the result of the recognition. Meanwhile, the flip chip bonder recognizes the LED chip 14 held by the collet, and calculates the position on the X-Y plane of the center point of the LED chip 14 (the position on the X-Y plane of the intersection of lines that bisect the LED chip 14 lengthwise and breadthwise respectively: the point G shown in FIG. 5) from the shape of the LED chip 14. Then, the flip chip bonder calculates the amount of the difference between the center point of the designed mounting location and the center point of the LED chip 14, and adjusts the position of the stage by moving the stage by the calculated amount. The flip chip bonder also calculates amount of the difference between the position that the LED chip 14 should take (normal mounting position) and the position that the LED chip held by the collet takes (i.e. how much the LED chip is rotated from its normal mounting position). If there is such a difference, the flip chip bonder rotates the collet (on its axis) to correct the difference. After that, the flip chip bonder lowers the collet (the LED chip 14 is to be placed on the designed mounting location on the wiring board 2), and performs the ultrasonic bonding.

The LED chip according to the present invention is for use with a lighting unit. Therefore, the power level of the ultrasonic vibration (more specifically the amplitude level) is several times larger compared to the case where the LED chip is for use with a display device and so on. The power level is usually approximately 200 (mW) when the LED chip is for use with a display device and so on, but in this case the power level is increased to approximately 1500 (mW) to mount the LED chip. More specifically, pressure at approximately 150 (g), and the ultrasonic vibration having a frequency of approximately 60 (kHz) and amplitude width of several μm is applied to the LED chip for approximately 0.3 seconds. Due to this ultrasonic vibration, the LED chip might be mounted after rotated by several degrees (approximately 2° here) from its normal mounting position. However, in case the LED chip is mounted in such a rotated position, the shapes of the wiring patterns 81 and 85 in the present invention are designed to prevent the p-electrode 145 and the n-electrode 146 from causing a short circuit, as described later.

The p-electrode 145 and the n-electrode 146 are disposed so as to oppose each other across an insulating region 150. In plan view, the width d of the insulating region 150 (i.e.

region between the p-electrode 145 and the n-electrode 146, hereinafter called the "electrode opposed region") measured at any point in the region is constant (approximately 20 µm here), just as a conventional LED chip. To realize high light-extraction efficiency, the width d is as narrow as possible in the manufacturing process.

Meanwhile, the wiring patterns 81 and 85 on the wiring board 2 are disposed so as to oppose each other across an insulating region 89. In the insulating region 89 (i.e. the region between the wiring patterns 81 and 85, hereinafter called the "pattern-opposed region"), the pattern distance D is shortest when measured in the first region (the region indicated by an arrow C, hereinafter called "the region C") including a point C' that is nearest to the point H (substantially nearest to the point G), where D=D1 (approximately 20 µm). In the second region (the region indicated by an arrow E, hereinafter called "the region E") and the third region (indicated by an arrow E', hereinafter called "the region E'"), which are located on both sides of the region C, the pattern distance D becomes longer as the distance from the point H increases, and the largest value of the distance D is "D2" (approximately 40 µm).

FIG. 2, as a plan view of the LED chip 14 taking its normal mounting position, shows that in the regions (the regions E and E') in which the pattern distance D becomes longer as a distance from the point H increases, pattern edges (outer edges) 811 and 812 of the wiring pattern 81 and pattern edges (outer edges) 851 and 852 of the wiring pattern 85, which adjoin the regions E and E', draw apart from electrode edges (outer edges) 148 and 149 so that the pattern distance D becomes longer as a distance from the point H increases (In other words, with respect to the electrode edges 148 and 149 of the respective p-electrode 145 and n-electrode 146 included in the LED chip 14 taking its normal mounting position, the pattern edges 811, 812, 851 and 852 recede (move back) inwardly as the distance from the point H (G) increases).

Such receding parts are made for preventing the p-electrode 145 and the n-electrode 146 from causing a short circuit in the case where the LED chip 14 is mounted after it is rotated a several degrees from its normal mounting position.

In other words, as described in Background Art, the LED chip wobbles around the collet. The LED chip wobbles, on the wiring board 2, around the center point of the collet or its vicinity as the center point of the rotation in clockwise or anticlockwise direction. In the pattern-opposed region 89, the amount of the wobble (moving distance) becomes larger in the regions E and E' that are far from the point G (H) than in the region C that is near to the point G (H). It is difficult to judge in which of the clockwise direction and the anticlockwise direction the LED chips is to be rotated from its normal mounting position (and to take a rotated position) before it is bonded onto the wiring board 2. (It is highly likely that the direction varies for each LED, depending on the surface condition of the wiring board 2, presence or absence of bumps, and the shapes of the bumps.

Therefore, the short circuit is prevented regardless of the rotative direction by shaping the pattern edges 811 and 812 of the wiring pattern 81 and the pattern edges 851 and 852 of the wiring pattern 85 so that the distance D becomes longer as the distance from the center point (the point G) of the LED chip 14 increases. In other words, the pattern edges 811 and 812 of the wiring pattern 81 and the pattern edges 851 and 852 of the wiring pattern 85 do not lap over the reach of the wobble of the electrode edges 148 and 149 of the p-electrode 145 and the n-electrode 146 for preventing the short circuit.

The region C is near to the center point of the LED chip 14, and it is to be hardly affected by the rotation. Therefore, in the region C, the distance between the patterns is made as short as possible so as to match the distance ("d") between the areas on the LED chip 14 corresponding to the region C. This maintains sufficient bonding areas between the p-electrode 145 and the wiring pattern 81 and between the n-electrode 146 and the wiring pattern 85, thereby increases the bonding strength.

Figure 6:
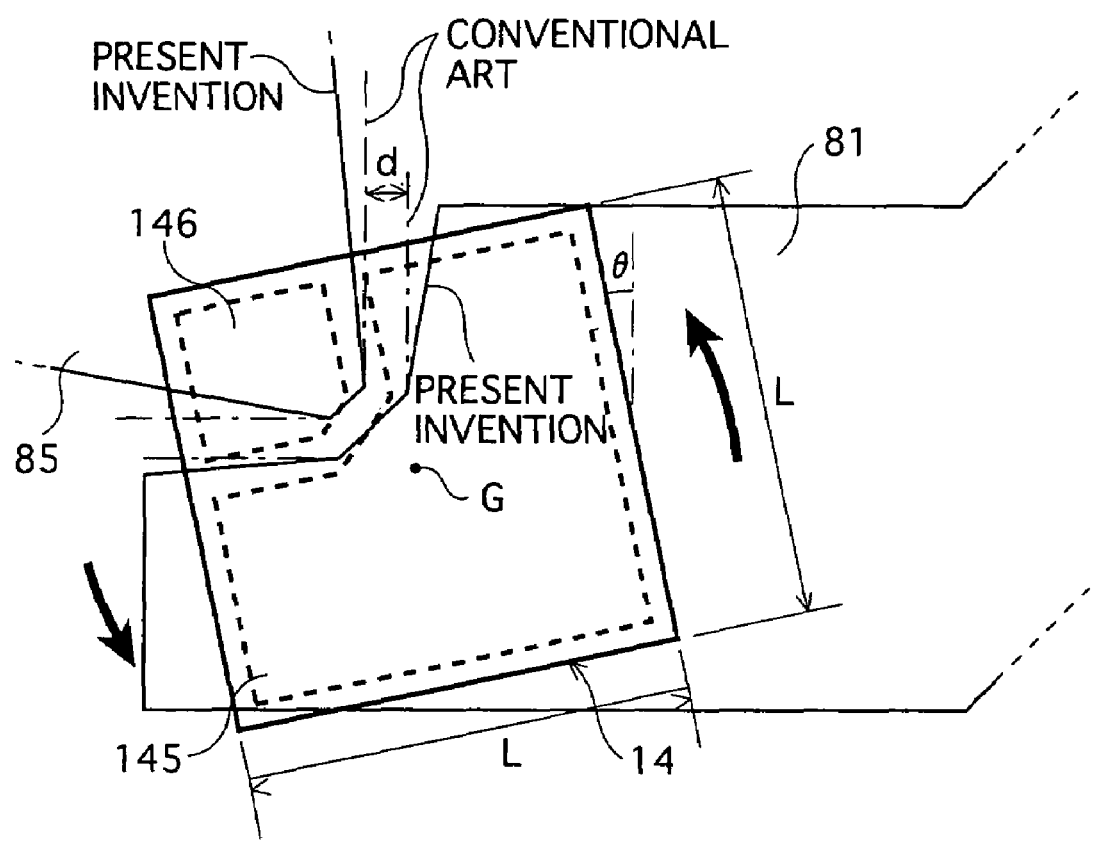
FIG. 6 is a plan view showing an example case where an LED chip 14 is mounted after it is rotated in the direction shown by an arrow.

FIG. 6 is a plan view showing an example case where an LED chip 14 is mounted after it is rotated in the direction shown by an arrow (the anticlockwise direction). The wiring patterns 81 and 85 of the embodiment of the present invention (illustrated in full line) and those of the conventional art (illustrated in dashed line) are both shown in FIG. 6. Note that the degree of the rotation is illustrated with exaggeration, and the actual rotation angle θ is less than 3° (0°<θ<3°).

As shown in FIG. 6, in the present invention, the pattern distance in the pattern-opposed region becomes longer as the distance from the center point of the LED chip 14 increases, and therefore the p-electrode 145 and the n-electrode 146 do not short out. To the contrary, in the conventional art, the pattern distance in the pattern-opposed region is constant at anywhere in the region, and therefore the p-electrode 145 and the n-electrode 146 short out at two points. FIG. 6 shows the case where the LED chip 14 is rotated anticlockwise from its normal mounting position. However, also in the case where the LED chip 14 is rotated the same degrees clockwise to from the normal mounting position, the p-electrode 145 and the n-electrode 146 do not short out in the present invention. This is because the pattern edges 811, 812, 851 and 852 recede inwardly as the distance from the center point (point G) of the LED chip 14 increases, so that the pattern edges 811, 812, 851 and 852 do not lap over the reach of the wobble of the electrode edges 148 and 149 of the p-electrode 145 and the n-electrode 146. If the LED chip 14 is mounted after rotated from its normal mounting position, it is not a problem for use of the LED chip 14 as a light source, because it does not affect the light distribution characteristic and so on.

Therefore, if the LED chip 14 is mounted after rotated from its normal mounting position because of the increased power level of the ultrasonic bonding at the time of the flip chip mounting, the p-electrode 145 and the n-electrode 146 do not cause a short circuit, and this significantly improves the yield ratio at manufacturing. Further, sufficient bonding area is maintained by forming the region C in the pattern-opposed region 89 so as to have the pattern distance that is almost equal to the distance between the electrodes on the corresponding LED chip (instead of just making the distance between patterns longer), and therefore sufficient bonding strength is maintained. This prevents cracks occurring at the junction between the LED chip 14 and the wiring board 2 due to the difference of thermal expansions between the LED chip 14 and the wiring board 2. As a result, the present invention can achieve effects of bonding the LED chip firmly to the wiring board and improving the yield ratio.

In the case where the wiring board 2 is made of resin, the power level of the ultrasonic bonding is required to be high because such a wiring board is softer than a silicon substrate and so on. Therefore, if this is the case, it is more likely that the LED chip 14 is mounted in the rotated position. However, the above-described structure improves the yield ratio in such a case. Therefore, the present invention is particularly effective in cases in which a substrate made of resin is used.

Furthermore, in the case of forming the wiring pattern by etching, it becomes easy to fill the pattern-opposed region with etching solution compared with the conventional art, because the width of the pattern-opposed region in the present invention becomes narrower as the distance from the center point becomes shorter, whereas width of the pattern-opposed region in the conventional art is almost constant at anywhere. Therefore, the present invention can achieve effects of improving the yield ratio in the etching process as well.

The shape of the LED chip 14 and the shapes of the wiring patterns 81 and 85 on which the LED chip 14 is to be mounted are described above. However, other LED chips 11, 12, 13, and 15 to 74 have the same shape as the LED chip 14, and the pattern shapes of the areas on which LED chips are to be mounted are the same as the above-described wiring patterns 81 and 85 as well. Each LED chip is to be mounted by the flip chip bonder one by one, in the same manner as the LED chip 14.

Here, the amounts of the inward recessions of the pattern edges 811, 812, 851 and 852 from the electrode edges 148 and the 149 of the LED chip 14 taking the normal mounting position are properly set according to the rotation angle of the LED chip rotated by the ultrasonic bonding. The rotation angle is previously calculated by experiments.

Specifically, in the regions E and E' shown in FIG. 2, an angle $\alpha$ formed by the pattern edge and the electrode edge that correspond to each other (e.g. 812 and 148, 852 and 149) satisfies $0<\alpha$. The angle $\alpha$ is larger than the maximum angle of the wobble of the electrode edge, which is formed by the rotation of the LED chip at the time of the mounting. More specifically, considering that the rotation angle $\theta$ (FIG. 6) of the LED chip at the time of the mounting is less than 3° and the angle $\alpha$ is an approximation of the above-described angle $\theta$, it is preferable that the angle $\alpha$ is, for instance, 3° or more than 3° (It is preferable that the upper limit is an angle that does not obstruct the bonding).

Furthermore, $Z<D1<D2$ (Formula 1) and $D1+L*\tan\theta+Z<D2$ (Formula 2) may be satisfied, where, in the pattern-opposed region 89, "D1" is the pattern distance of the area that is nearest to the center point of the LED chip, "D2" is the pattern distance of the area that is farthest from the center point of the LED chip, "$\theta$" is the maximum rotation angle at the time of the mounting (the rotation angle at the time when the LED chip is rotated the maximum degrees from the normal mounting position), "Z" is the difference between the designed mounting location and the actual mounting location in the case where the LED chip is mounted on the wiring board 2 after its position is adjusted by the collet in the manufacturing process (This difference is caused depending on the performance of the collet, such as the pitch of the movement.) (The difference "Z" is, more specifically, a distance between the above-described points G and H measured in the direction that is parallel to the width direction of the above-described distance D2.), and "L" is the side length of the LED chip (i.e. the length of a side of the LED chip mounted on the wiring board 2, which is almost orthogonal to the width direction of the above-described distance "D2".) In the case where the difference Z is negligible, $D1+L*\tan\theta<D2$ may be satisfied.

As described above, it is known by experiments that the rotation angle $\theta$ of the LED chip is substantially less than 3°. Therefore, also in this case, the distance D2 can be calculated by setting 3° or more than 3° (an angle that does not obstruct the bonding) to "$\theta$" in $\tan\theta$.

The Second Embodiment

The shapes of the wiring patterns for the p-electrodes and the n-electrodes on the wiring board are designed to prevent the short circuit in the above-described first embodiment. The second embodiment is about the designs of the shapes of the electrodes on the LED chip. In the following description, the same signs are used for representing the materials and the things that are the same as those in the first embodiment.

Figure 7:
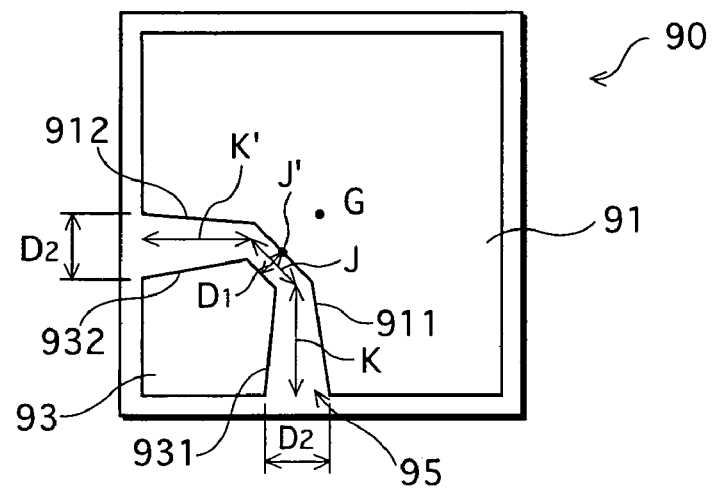
FIG. 7 is a plan view of a reverse surface of an LED chip 90 according to the second embodiment, on which electrodes are disposed.
Figure 8:
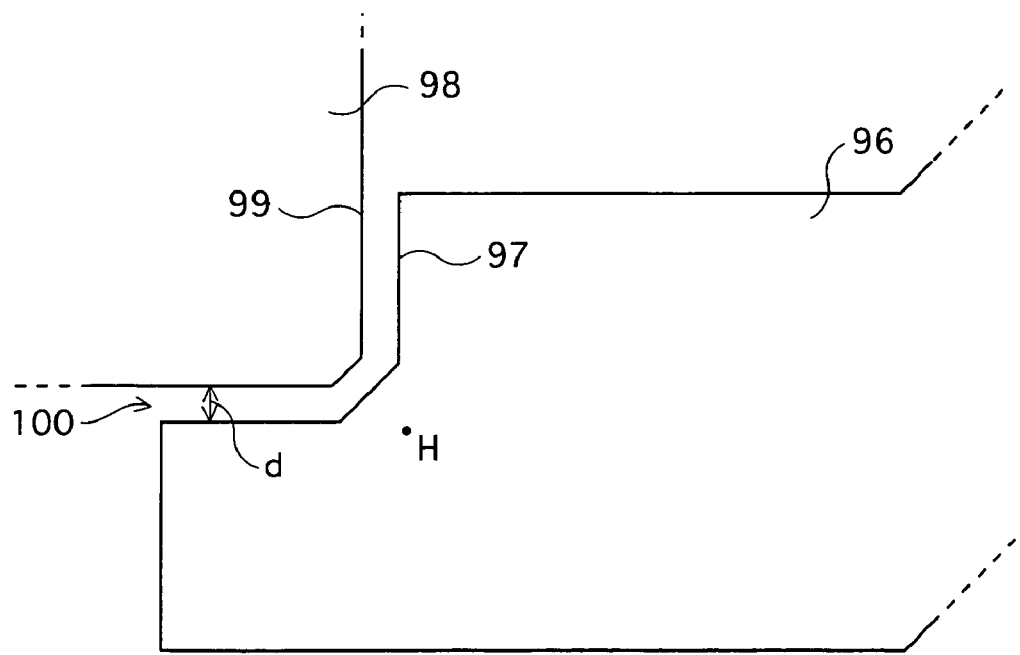
FIG. 8 is a plan view showing configurations of wiring patterns 96 and 98 via which an LED chip 90 is mounted on a wiring board 2.
Figure 9:
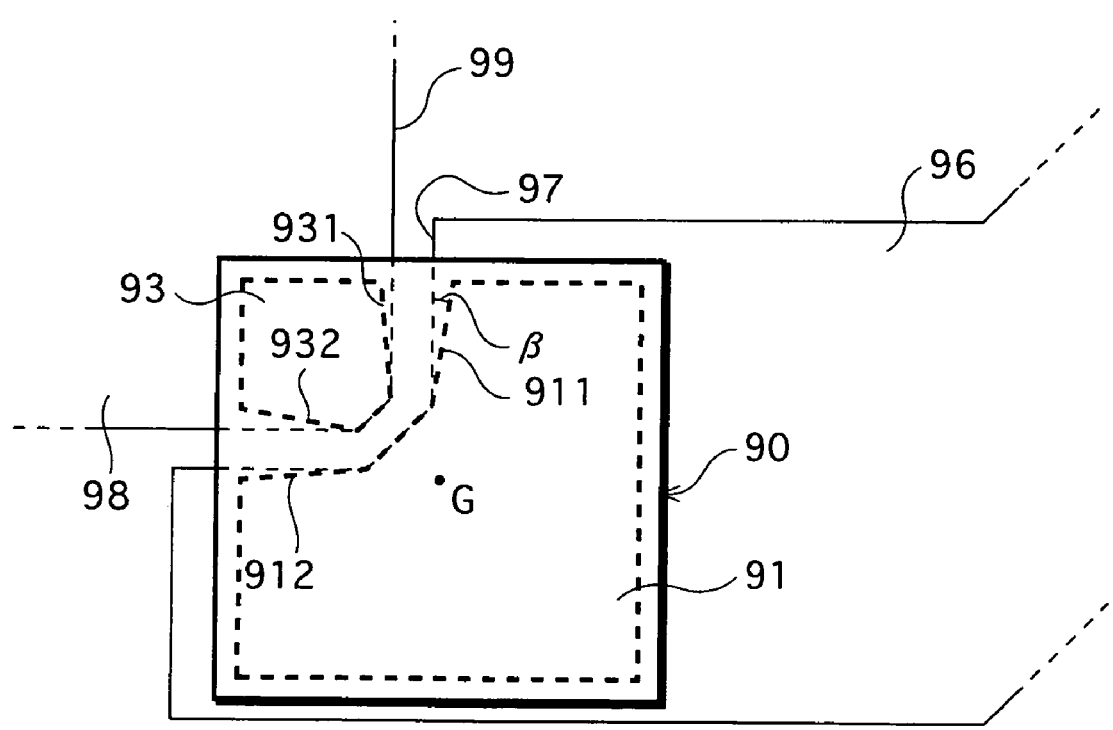
FIG. 9 is a plan view showing an LED chip 90 which is mounted exactly on a designed mounting location.

FIG. 7 is a plan view of a reverse surface of an LED chip 90 according to the second embodiment, on which electrodes are disposed, and FIG. 8 is a plan view showing configurations of wiring patterns 96 and 98 via which the LED chip 90 is mounted on the wiring board 2. FIG. 9 is a plan view showing the LED chip 90 which is mounted exactly on the designed mounting location. In FIG. 9, to make clear distinction between the LED chip 90 and wiring patterns 96 and 98, the LED chip 90 is drawn with thick lines, and a p-electrode 91 and an n-electrode 93 are drawn as viewed through the LED chip 90.

As shown in each figure, the width of the pattern-opposed region 100 (the insulating region) between the wiring patterns 96 and 98 is d (approximately 20 μm) without variation.

Meanwhile, in the electrode-opposed region 95 (the insulating region) of the LED chip 90, the electrode distance is shortest when measured in the first region (the region indicated by an arrow J, hereinafter called "the region J") including a point J' that is nearest to the center point of the LED chip 90 (the point G), where D is "D1" (approximately 20 μm). In the second region (the region indicated by an arrow K, hereinafter called "the region K") and the third region (indicated by an arrow K', hereinafter called "the region K'"), which are located on both sides of the region J, the electrode distance becomes longer as the distance from the point G increases, and the largest value of the electrode distance D is "D2" (approximately 40 μm).

In the regions K and K', electrode edges (outer edges) 911 and 912 of the p-electrode 91 and electrode edges (outer edges) 931 and 932 of the n-electrode 93, which adjoin the regions K and K' respectively, draw apart from a pattern edge (outer edge) 97 of the wiring pattern 96 and a pattern edge 99 of the wiring pattern 98 so that the electrode distance becomes longer as a distance from the point G increases. In other words, with respect to the pattern edges 97 and 99 of the respective wiring patterns 96 and 98 corresponding to the p-electrode 91 and the n-electrode 93 of the LED chip 90 taking the normal mounting position, the electrode edges 911, 912, 931 and 932 recede (move back) inwardly as a distance from the point H increases, so that the electrode edges 911, 912, 931 and 932 do not contact with the pattern edge 97 of the wiring pattern 96 and the pattern edge 99 of the wiring pattern 98.

Just as in the first embodiment, such receding parts are made for preventing the p-electrode and the n-electrode from causing a short circuit in the case where the LED chip 90 is mounted after it is rotated a several degrees from its normal mounting position. This significantly improves the yield ratio at manufacturing, and prevents cracks occurring at the junction.

Note that each of the other sixty-three LED chips has the same shape as that of the LED chip 90, and the shape of the wiring pattern for each LED chip is the same as that of the wiring patterns 96 and 98.

Just as in the first embodiment, the amounts of the inward recessions of the electrode edges are properly set according to the rotation angle of the LED chip rotated by the ultrasonic bonding. The rotation angle is previously calculated by experiments. The positional relation between the electrode edges and the pattern edges in the regions K and K' is substantially the same as that in the first embodiment. Therefore, as FIG. 9 shows, at the time when the LED chip takes the normal mounting position, an angle β (the counterpart of the above-described angle α) formed by the pattern edge and the electrode edge that correspond to each other (e.g. 911 and 97, 931 and 99) can be calculated in the same manner as in the first embodiment. Further, it is possible to set D2 and so on so as to satisfy the above-described formulas 1 and 2, as in the first embodiment.

Modifications

The present invention is described above based on the embodiments. However, the present invention is not limited to the embodiments. The followings are possible modifications.

Figure 10A:
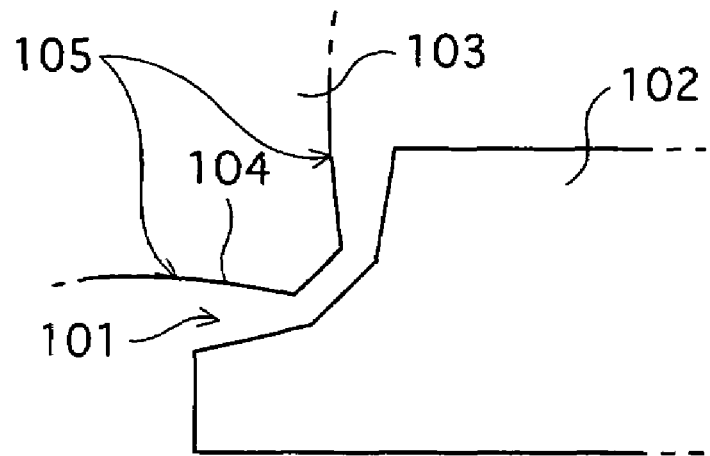
FIG. 10A shows example pattern configurations of a wiring pattern 102 used for a p-electrode and a wiring pattern 103 used for an n-electrode according to a modification of the present invention.

(1) The shapes of the wiring patterns in the first embodiment are not limited to the above-described shapes. For instance, the wiring patterns may have shapes shown in FIG. 10. In FIG. 1A, a wiring pattern 102 for the p-electrode in the pattern-opposed region 101 has almost the same shape as the above-described wiring pattern 81, but a pattern edge 104 of the wiring pattern 103 for the n-electrode differs from the above-described wiring pattern 85 in that the pattern edge 104 is bended at a point 105.

Figure 10B:
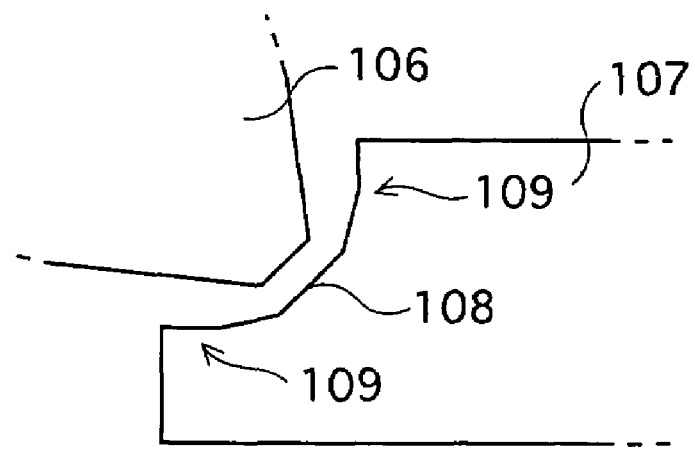
FIG. 10B shows other example pattern configurations.

In FIG. 10B, a wiring pattern 106 for the n-electrode has almost the same shape as the above-described wiring pattern 85, but a pattern edge 108 of the wiring pattern 107 for the p-electrode differs from the above-described wiring pattern 81 in that the pattern edge 108 is bended at a point 109.

(2) The first embodiment describes, as FIG. 5 shows, an example of the shapes of the wiring patterns in the case where the LED chip having the structure in which the n-electrode is disposed on a corner of a substantially square-shaped sapphire substrate. However, in the case where a LED chip 110 having the structure shown in FIG. 11A is used, the shape of the wiring patterns may be those shown in FIG. 11B.

Figure 11A:
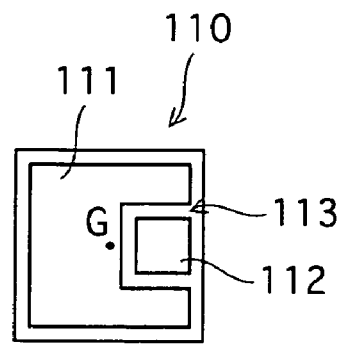
FIG. 11A shows example configurations of a p-electrode and an n-electrode on an LED chip 110 according to a modification of the present invention.
Figure 11B:
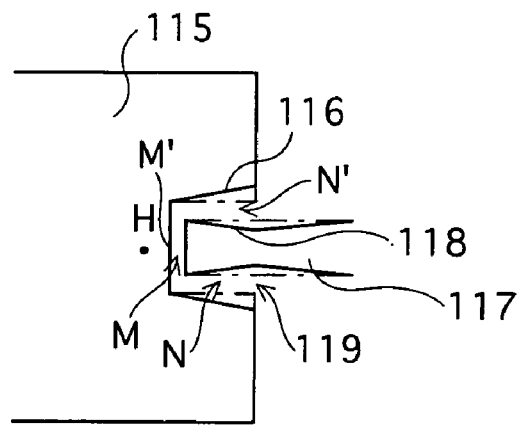
FIG. 11B shows example configurations of wiring patterns 115 and 116 in the case where the LED chip 110 is used.

In FIG. 11A, a sign 111 indicates a p-electrode on the LED chip 110, a sign 112 indicates an n-electrode on the LED chip 110, and the distance between the p-electrode 111 and the n-electrode 112 in a electrode-opposed region 113 is constant, that is approximately 20 (μm) here. In FIG. 11B, a sign "115" indicates a wiring pattern for the p-electrode, and a sign "117" indicates a wiring pattern for the n-electrode. In this figure, the conventional wiring patterns are illustrated in dashed line for comparison. A point G is the center point of the LED chip 110, and a point H is the center point of the designed mounting location on which the LED chip 110 is to be mounted.

As FIG. 11B shows, the distance between the wiring patterns 115 and 117 in a pattern-opposed region 119 is the shortest (e.g. approximately 20 μm) in a region M including a point M' that is nearest to the point H. The distance increases in the regions N and N', which are on both ends of the region M, as the distance from the point H increases, and the distance is the longest (e.g. approximately 40 μm) when it is measured at the farthest point from the point H. In the regions N and N', the pattern edges 116 and 118 draw apart from the electrode edges (illustrated in dashed line) of the p-electrode 111 and the n-electrode 112 on the LED chip 110 taking its normal mounting position so that the distance becomes longer as a distance from the point H increases. (The pattern edges 116 and 118 inwardly recede so that the electrode edges do not lap over the reach of the wobble of the electrode edges, which is caused by the rotation at the time of the flip chip mounting.)

Therefore, even if the LED chip 110 is mounted after it is rotated from its normal mounting position at the time of the flip chip mounting, the p-electrode and the n-electrode do not cause a short circuit, and this significantly improves the yield ratio at manufacturing and prevents cracks occurring at the junction part.

Figure 12:
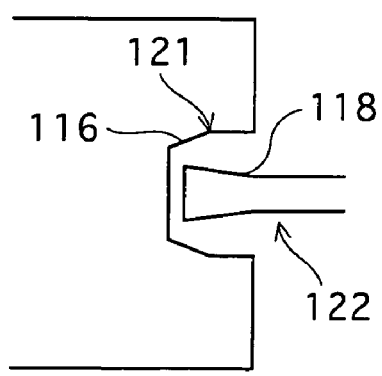
FIG. 12 shows another configuration of a wiring pattern according to a modification of the present invention.

FIG. 12 shows a modification of the wiring patterns in FIG. 11B. A part of the pattern edge 116 is bended at a part 121, and a part 122 of the pattern edge 118 is formed so as to be parallel to the opposed part of the pattern edge.

Figure 13A:
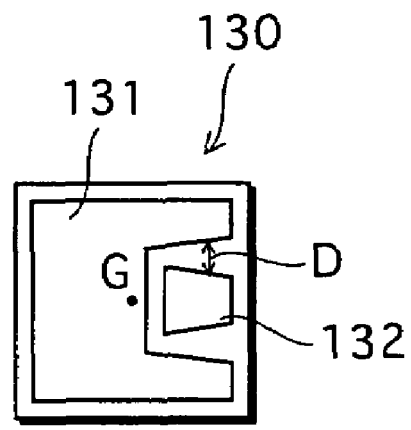
FIG. 13A shows example configurations of a p-electrode 131 and an n-electrode 132 on another LED chip 130 according to a modification of the present invention.
Figure 13B:
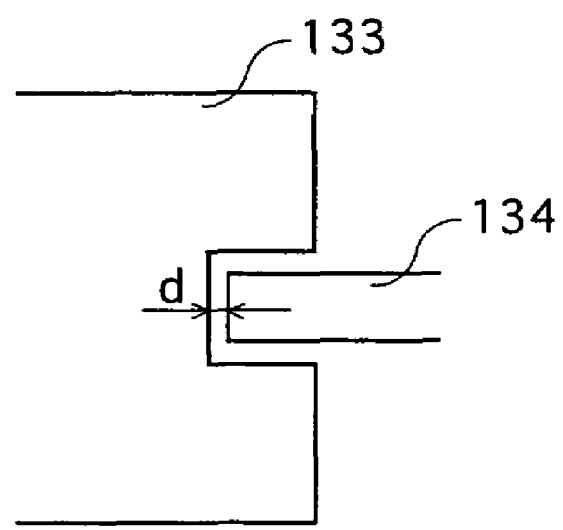
FIG. 13B shows example configurations of wiring patterns 133 and 134 in the case where the LED chip 130 is used.

(3) As FIG. 13A shows, the LED chip 130 may have a structure in which the distance D in the electrode-opposed region between a p-electrode 131 and an n-electrode 132 becomes longer as a distance from the point G increases. In this case, the distance d in the pattern-opposed area between a wiring pattern 133 for the p-electrode and a wiring pattern 134 for the n-electrode may be constant as shown in FIG. 13B.

Note that in the above-described pattern edge of the wiring pattern in the pattern-opposed region, the bended part has an angular shape. However, the part may have a curved shape. Also, the pattern edge is not limited to a straight line. The pattern edge may be a curved line or may be in a staircase pattern.

In other words, the shape of each pattern edge (outer edge) is not limited to any particular shape as long as the pattern edge includes a receding part that recedes inwardly as the distance from the center point of the LED chip increases with respect to the electrode edge of the LED chip so that the pattern edges do not lap over the reach of the wobble of the electrode edges caused by the rotation at the time of the flip chip mounting. Therefore, if an LED chip has an electrode-opposed region in which the distance is not constant, the wiring pattern corresponding to the LED chip should be formed so that the pattern edges do not lap over the reach of the wobble of the electrode edges, which is caused by the rotation at the time of the flip chip mounting. The same is true on the electrodes edges in the electrode-opposed region.

Figure 14:
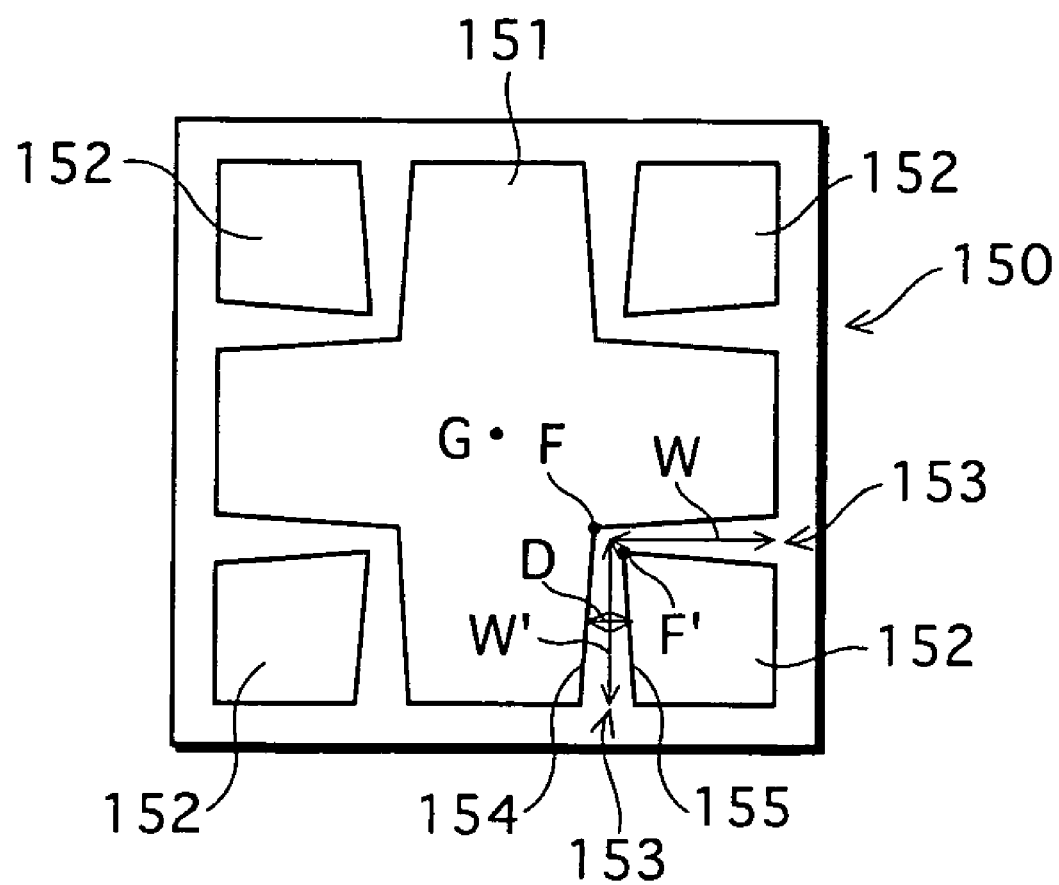
FIG. 14 is a plan view showing example configurations of a p-electrode 151 and an n-electrode 152 on an LED chip 150 according to a modification.

(4) As an example arrangement of the electrode of the LED chip, the structure shown in FIG. 14 may be used. In an LED chip 150, a p-electrode 151 is in a shape of a cross, and four n-electrodes 152 are disposed in the unoccupied space. In each electrode-opposed region 153 between the p-electrode 151 and the n-electrode 152, the shortest electrode distance is in the first region (the region between points F and F', which are the bending points of electrode edge (the part corresponding to a line segment that has a constant minute width and connects the point F with the point F')) including the point F that is nearest to the point G. In the second region (indicated by an arrow W) and the third region (indicated by an arrow W'), which are located on both sides of the first region, the electrode distance becomes longer as the distance from the center point (the point G) increases, and the electrode edge 154 of the p-electrode 151 and the electrode edge 155 of the n-electrode 152 draw apart (recede inwardly) from the pattern edges of the wiring patterns for the p-electrode and the n-electrode of the LED chip 150 taking its normal mounting position (i.e. the wiring pattern of which the width of the pattern-opposed region is constant and substantially the same as the width of the above-described first region. Not illustrated.) so that the electrode distance D becomes longer as a distance from the point G increases. Accordingly, the p-electrode and the n-electrode do not cause a short circuit at the time of the flip chip mounting.

The LED chip 150 in this example, the electrode-opposed region 153 is L-shaped in the plan view, which is bent at the point F nearest to the center point G. Therefore, the line segment that has a constant minute width and connects the point F and the point F' is assumed as a region and called the first region. However, in the case where the wiring pattern, not the electrode, has such a shape, the bending point (the counterpart of the above-described line-segment part) may be assumed as the first region and the regions on both ends of the first region may be assumed as the second and the third regions respectively.

(5) In the abode-described first embodiment, the pattern edges 811 and 812 of the pattern edge 81 and the pattern edges 851 and 852 of the pattern edge 85 are formed so as to recede inwardly, as the distance from the center point of the LED chip increases, with respect to the electrode edges 148 and 149 of the p-electrode 145 and the n-electrode 146, because it is difficult to judge in which direction the LED chips is to be rotated from its normal mounting position before it is mounted.

However, there are cases where the rotative direction can be judged from the shape of the electrodes and the wiring patterns at the surface of the junction, the shapes of bumps and so on. In such cases, it is possible to form the pattern edges so that the receding part is formed only on the side corresponding to the rotative direction.

Figure 15A:
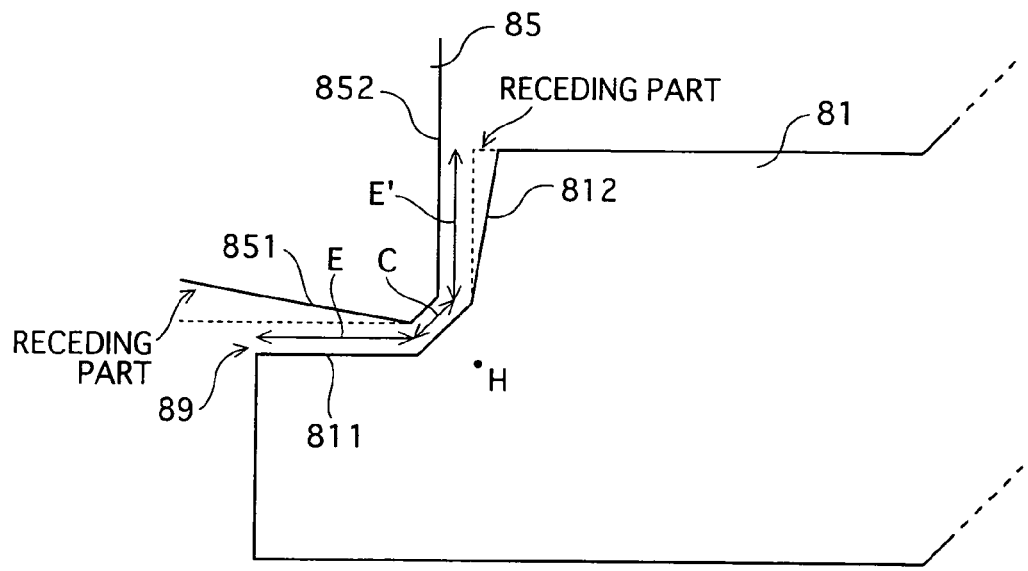
FIG. 15A shows a modification of a configuration of a wiring pattern in the case where an LED chip 150 is rotated clockwise at the time of the mounting.

FIG. 15A is a plan view of the wiring pattern, showing an example shape of the wiring pattern for the case where the rotative direction of the LED chip has judged to be clockwise.

In this modification shown in FIG. 15A, in the pattern-opposed region 89, the pattern edge 851 of the wiring pattern 85 adjoining the region E and the pattern edge 812 of the wiring pattern 81 adjoining the region E' are formed so as to recede inwardly (draw apart), as the distance from the center point H of the LED chip increases, with respect to the electrode edges 148 and 149 (illustrated in broken line) of the p-electrode 145 and the n-electrode 146 of the optical semiconductor bare chip taking the normal mounting position. The pattern edge 811 of the wiring pattern 81 adjoining the region E and the pattern edge 852 of the wiring pattern 85 adjoining the region E' do not recede inwardly (not draw apart), which means that they are at the conventional positions as FIG. 6 shows.

In this way, by forming the pattern edges so as to recede inwardly and not to lap over the reach of the wobble of the electrode edges, which is caused by the rotation at the time of the flip chip mounting, it becomes possible to prevent the p-electrode and the n-electrode from causing a short circuit in the case where the LED chip is mounted after it is rotated clockwise several degrees from its normal mounting position.

Figure 15B:
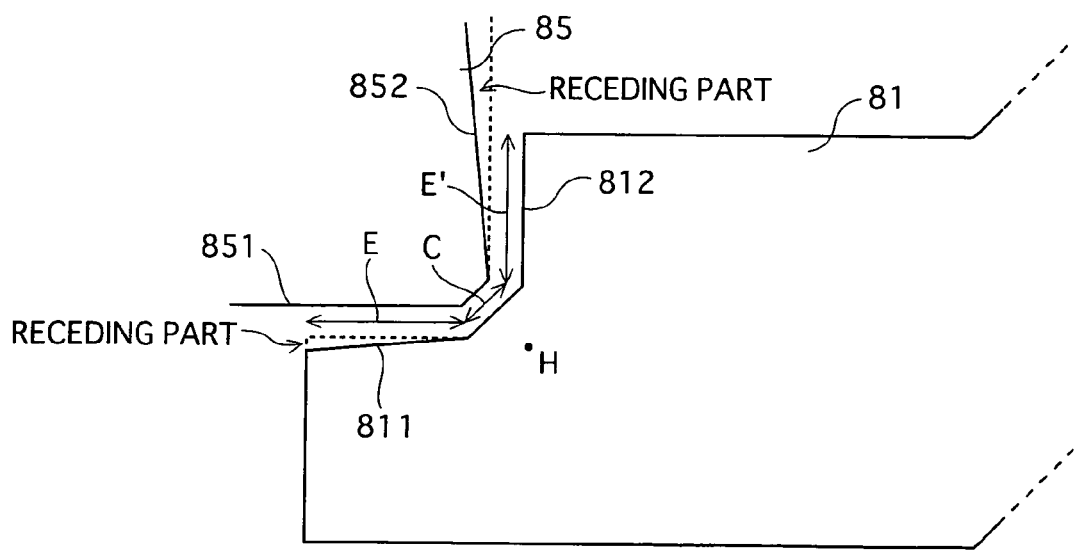
FIG. 15B shows the same in the case where the LED chip 150 is rotated anti-clockwise at the time of the mounting.

FIG. 15B is a plan view of the wiring pattern, showing an example shape of the wiring pattern for the case where the rotative direction of the LED chip has judged to be anticlockwise.

In FIG. 15B, on the contrary to FIG. 15A, in the pattern-opposed region 89, the pattern edge 811 of the wiring pattern 81 adjoining the region E and the pattern edge 852 of the wiring pattern 85 adjoining the region E' are formed so as to recede inwardly (draw apart), as the distance from the center point H of the LED chip increases, with respect to the electrode edges 148 and 149 (illustrated in broken line) of the p-electrode 145 and the n-electrode 146 of the optical semiconductor bare chip taking the normal mounting position. The pattern edge 851 of the wiring pattern 85 adjoining the region E and the pattern edge 812 of the wiring pattern 81 adjoining the region E' do not recede inwardly (not draw apart), which means that they are at the conventional positions as FIG. 6 shows.

In this way, by forming the pattern edges so as to recede inwardly and not to lap over the reach of the wobble of the electrode edges, which is caused by the rotation at the time of the flip chip mounting, it becomes possible to prevent the p-electrode and the n-electrode from causing a short circuit in the case where the LED chip is mounted after it is rotated anticlockwise several degrees from its normal mounting position.

This is applicable to the LED chip described in the second embodiment as well.

Figure 16:
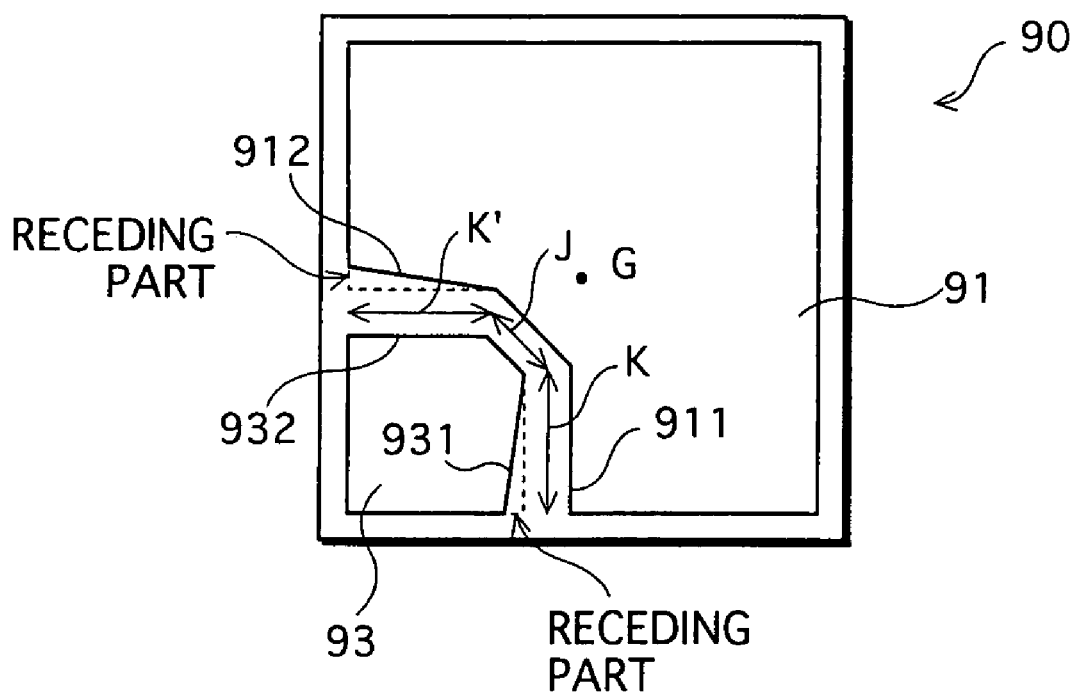
FIG. 16 shows example shapes of a p-electrode and an n-electrode of an LED chip of a modification.

FIG. 16 shows an example shape of the LED chip in the case where the rotative direction at the time of the mounting has judged to be clockwise.

As shown in FIG. 16, in the electrode-opposed region, the electrode edge 931 of the n-electrode 93 adjoining the region K, and the electrode edge 912 of the n-electrode 91 adjoining the region K' are formed so as to recede inwardly (draw apart) from the center point (point G) with respect to the pattern edges 97 and 99 (illustrated in broken line in FIG. 16) of the wiring patterns 96 and 98 (FIG. 8) of the LED chip taking the normal mounting position. The electrode edge 911 of the p-electrode 91 adjoining the region K and the electrode edge 932 of the n-electrode 93 adjoining the region K' do not recede inwardly, which means that they are at the conventional positions.

In this way, by forming the electrode edges so as to recede inwardly and not to lap over the wiring patterns even if the LED chip is rotated clockwise several degrees at the time of the flip chip mounting, it becomes possible to prevent the p-electrode and the n-electrode from causing a short circuit in the case where the LED chip is mounted after it is rotated clockwise several degrees from its normal mounting position.

Note that in the case where the rotative direction at the time of the mounting is anticlockwise, the electrode edges 911 and 932 recede inwardly, and 912 and 931 do not recede on the contrary to the above-described case.

(6) The structure of the lighting unit including the sixty-four LED chips flip-chip mounted on the wiring board is described above. The present invention is applicable to a lighting apparatus using the lighting unit as the light source.

Figure 17:
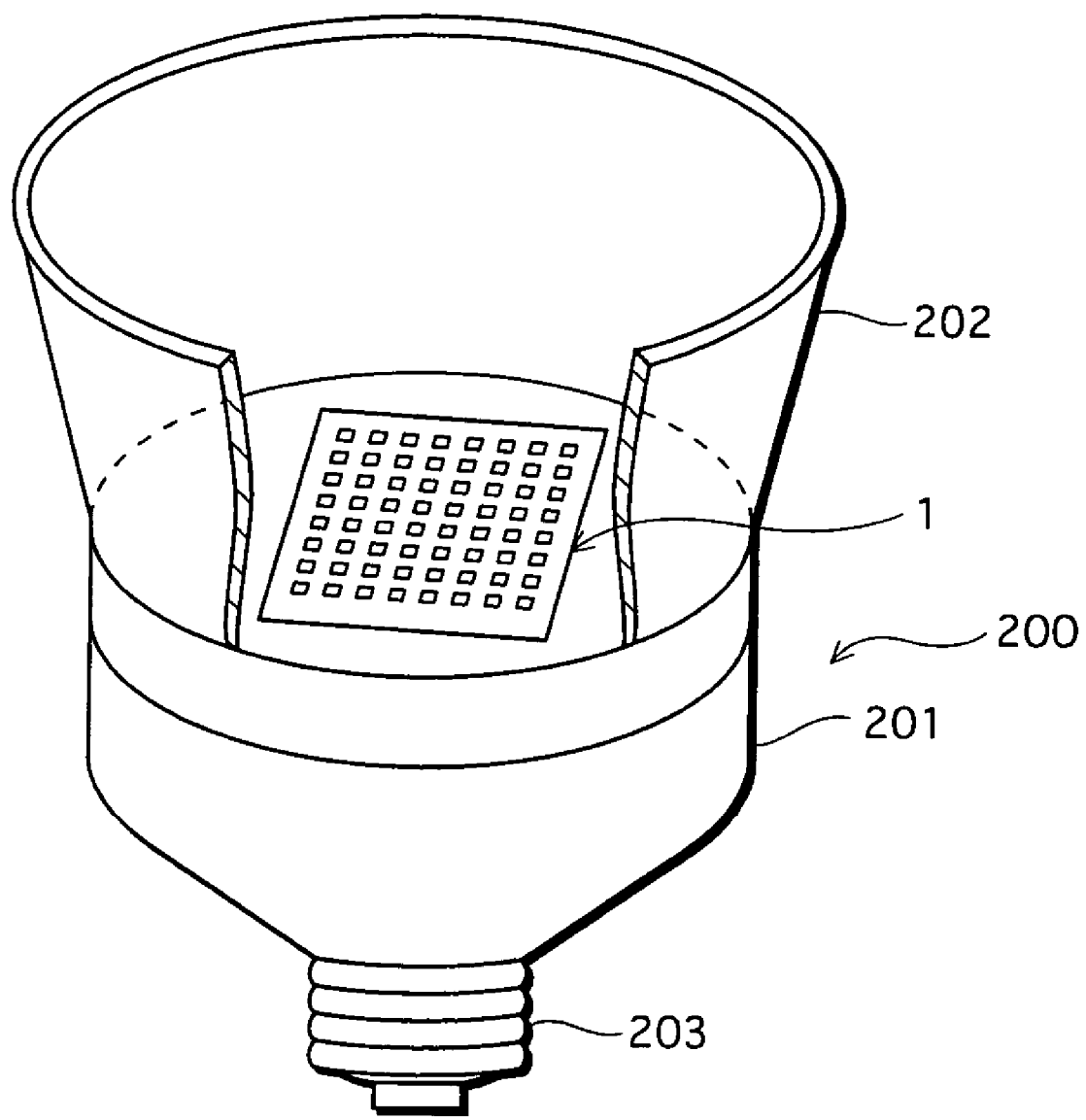
FIG. 17 is a perspective view showing a structure of a lighting apparatus 200 using a lighting unit 1.
Figure 18A:
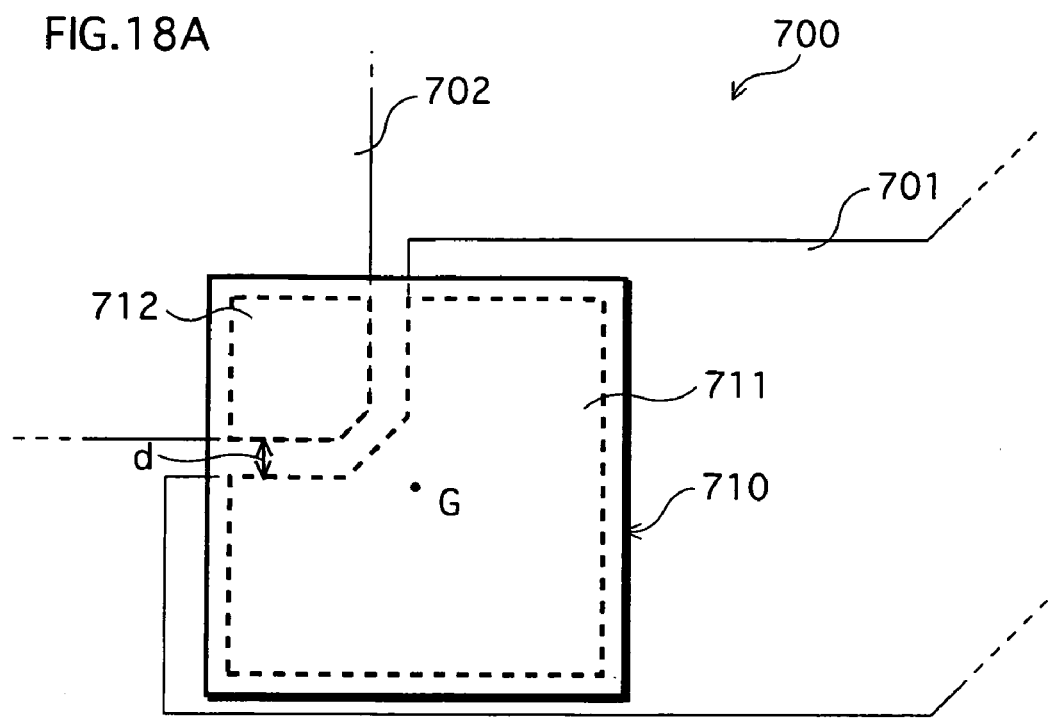
FIG. 18A is an enlarged plan view showing a conventional LED chip 710 flip-chip mounted on a wiring pattern 701 for a p-electrode and a wiring pattern 702 for a n-electrode at a normal mounting position.
Figure 18B:
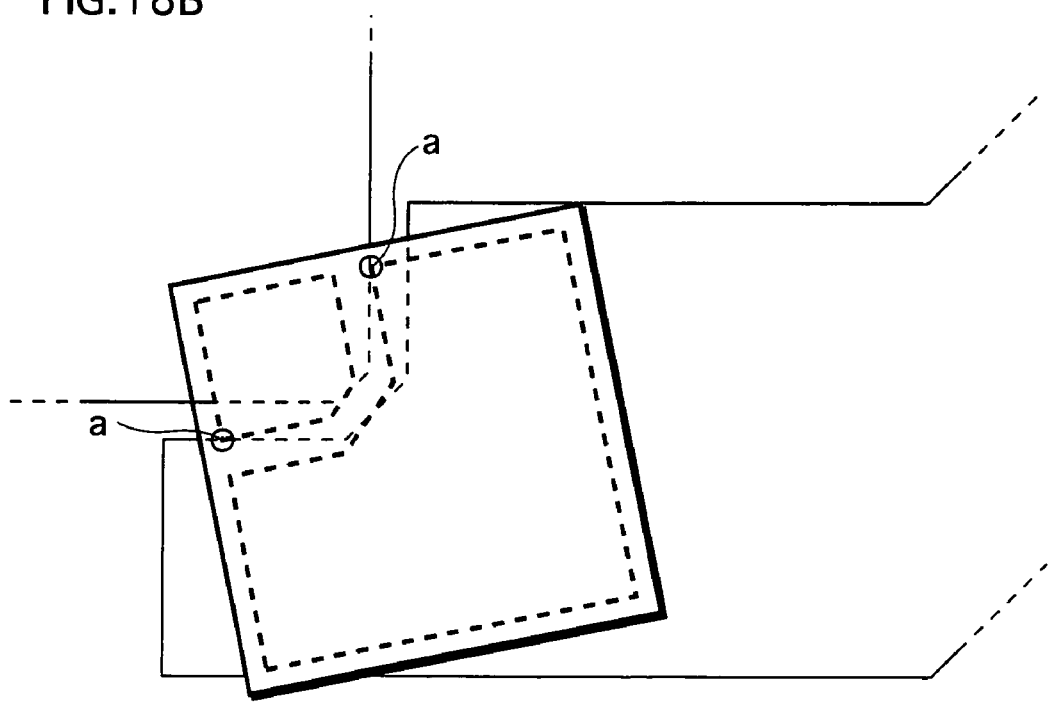
FIG. 18B shows a LED chip 710 mounted after it is rotated a certain degree from its normal mounting position.

FIG. 17 is a perspective view showing an example structure of a lighting apparatus 200.

As shown in FIG. 17, the lighting apparatus 200 has a shape of a light bulb, and includes a case 201, a reflecting shade 202, a base 203, and a lighting unit 1 as the light source. The size of the base 203 is the same as the size of a base used for general light bulbs, such as incandescent lamps (i.e. the bases are in the same standard).

A feeding unit (not illustrated) used for feeding the lighting unit 1 is disposed in the case 201. The feeding unit includes a publicly known circuit that converts the alternating current supplied via the base 203 to the direct current for lighting the LED chip, and supplies the direct current to the lighting unit 1. The lighting unit 1 to be used as the light source is in a form of a plate. Therefore, the lighting apparatus itself can be downsized to a considerable degree (especially in its overall length) compared to incandescent lamps.

The present invention is also applicable to a table lamp, a flashlight and so on, as the lighting apparatus using the above-described lighting unit 1 as the light source.

(7) Although the wiring board described above is a substrate made of resin, the present invention is not limited to this. For instance, a silicon substrate may be used. Although gold (Au) is used for the wiring patterns, other materials, with which the ultrasonic bonding is available such as copper (Cu), may be used. Although the 300 μm-square LED chip is used in the above-described embodiments, the size of the LED chip is not limited to this as a matter of course. For instance, a 100 μm-square to 900 μm-square LED chip or an LED chip of millimeters order may be used. Especially, the p-electrode and the n-electrode of the LED chip can be effectively prevented from causing a short circuit in the case where 100 μm-square to 900 μm-square LED chip are densely mounted.

Furthermore, the present invention is applicable not only to the wiring board and the LED chip to which the ultrasonic bonding is applied, but also the cases where other bonding methods which might cause a rotation of the LED chip at the time of the bonding are used. The present invention is applicable not only to the LED chip, but also to an optical semiconductor bare chip, such as a semiconductor laser, and a printed wiring board used for mounting the bare chip thereon, and a lighting unit and a lighting apparatus using the bare chip.

INDUSTRIAL APPLICABILITY

The present invention is applicable to an optical semiconductor bare chip such as an LED, a printed wiring board used for mounting the optical semiconductor bare chip thereon, a lighting unit, and a lighting apparatus.

The invention claimed is:

1. A printed wiring board having first and second wiring patterns that are formed on a mounting surface thereof so as to oppose each other across an insulating region, an optical semiconductor bare chip being flip-chip mounted on the mounting surface and having, on one surface thereof, first and second electrodes that are disposed so as to oppose each other, and the first and second wiring patterns respectively corresponding in position and shape to the first and second electrodes, wherein
in a plan view of the insulating region divided into a first region that includes a point nearest to a center point of the optical semiconductor bare chip that takes a normal mounting position, and second and third regions that sandwich the first region, (i) an outer edge portion of the first wiring pattern which adjoins the second region, and an outer edge portion of the second wiring pattern which adjoins the third region, and/or (ii) an outer edge portion of the first wiring pattern which adjoins the third region, and an outer edge portion of the second wiring pattern which adjoins the second region, are formed so as to recede inwardly as a distance from the center point increases with respect to outer edges of the first and second electrodes of the optical semiconductor bare chip that takes the normal mounting position.

2. The printed wiring board of claim 1, wherein
in a case where a distance between the first and second electrodes measured at any point is substantially constant, the width of the first region is substantially constant and substantially equal to the distance between the first and the second electrodes.

3. A lighting unit in which an optical semiconductor bare chip is flip-chip mounted on a printed wiring board thereof, wherein the printed wiring board is one of the printed wiring boards defined in claim 2.

4. The printed wiring board of claim 1, wherein
the first and second wiring patterns are formed on a surface of an insulating plate that is a composite substrate including an inorganic filler and a resin composite.

5. A lighting unit in which an optical semiconductor bare chip is flip-chip mounted on a printed wiring board thereof, wherein the printed wiring board is one of the printed wiring boards defined in claim 4.

6. The printed wiring board of claim 1 in which the optical semiconductor bare chip is flip-chip mounted on the printed wiring board thereof.

7. An optical semiconductor bare chip having first and second electrodes that are disposed on one surface thereof so as to oppose each other across an insulating region, the semiconductor bare chip being flip-chip mounted on a mounting surface of a printed wiring board having first and second wiring patterns that are formed on the mounting surface so as to oppose each other, the first and second wiring patterns respectively corresponding in position and shape to the first and second electrodes, wherein
in a plan view of the insulating region divided into a first region that includes a point nearest to a center point of the optical semiconductor bare chip, and second and third regions that sandwich the first region, (i) an outer edge portion of the first electrode which adjoins the second region and an outer edge portion of the second electrodes which adjoins the third region, and/or (ii) an outer edge portion of the first electrode which adjoins the third region and an outer edge portion of the second electrode which adjoins the second region, are formed so as to recede inwardly as a distance from the center point increases with respect to outer edges of the first and second wiring patterns that respectively correspond to the first and second electrodes of the optical semiconductor bare chip that takes a normal mounting position.

8. The printed wiring board of claim 7, wherein
in a case where a distance between the first and second wiring patterns measured at any point is substantially constant, the width of the first region is substantially constant and substantially equal to the distance between the first and the second wiring patterns.

9. A lighting unit in which an optical semiconductor bare chip is flip-chip mounted on a printed wiring board, wherein the optical semiconductor bare chip is one of the optical semiconductor bare chips defined in claim 8.

10. The printed wiring board of claim 7 in which the optical semiconductor bare chip is flip-chip mounted on the printed wiring board.

* * * * *